(12) United States Patent
Summerfelt et al.

(10) Patent No.: US 8,329,588 B2
(45) Date of Patent: Dec. 11, 2012

(54) PASSIVATION OF INTEGRATED CIRCUITS CONTAINING FERROELECTRIC CAPACITORS AND HYDROGEN BARRIERS

(75) Inventors: Scott R. Summerfelt, Garland, TX (US); Ted S. Moise, Dallas, TX (US); Gul B. Basim, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/303,541

(22) Filed: Nov. 23, 2011

(65) Prior Publication Data

US 2012/0070993 A1 Mar. 22, 2012

Related U.S. Application Data

(62) Division of application No. 12/717,604, filed on Mar. 4, 2010.

(60) Provisional application No. 61/158,178, filed on Mar. 6, 2009.

(51) Int. Cl.
*H01L 21/311* (2006.01)

(52) U.S. Cl. .................................. 438/703; 257/E21.24
(58) Field of Classification Search .................. 438/703; 257/E21.24
See application file for complete search history.

(56) References Cited

U.S. PATENT DOCUMENTS

| | | | | |
|---|---|---|---|---|
| 4,863,755 | A | * | 9/1989 | Hess et al. ..................... 427/574 |
| 6,218,197 | B1 | * | 4/2001 | Kasai ................................ 438/3 |
| 7,339,218 | B2 | * | 3/2008 | Hidaka et al. .................. 257/295 |
| 2004/0235259 | A1 | * | 11/2004 | Celii et al. ..................... 438/396 |
| 2006/0033138 | A1 | * | 2/2006 | Fukada ......................... 257/296 |
| 2006/0073613 | A1 | * | 4/2006 | Aggarwal et al. ................. 438/3 |
| 2006/0226457 | A1 | * | 10/2006 | Abe ............................... 257/295 |
| 2009/0256259 | A1 | * | 10/2009 | Kanaya ......................... 257/751 |
| 2010/0090340 | A1 | | 4/2010 | Summerfelt et al. |
| 2011/0079878 | A1 | | 4/2011 | Aggarwal et al. |
| 2011/0079884 | A1 | | 4/2011 | Basim et al. |

* cited by examiner

*Primary Examiner* — Julio J Maldonado
*Assistant Examiner* — Robert Bachner
(74) *Attorney, Agent, or Firm* — Rose Alyssa Keagy; Wade J. Brady, III; Frederick J. Telecky, Jr.

(57) ABSTRACT

A method for forming a hydrogen barrier layer that overlies ferroelectric capacitors and a buffer region but is removed from a portion of the logic region.

12 Claims, 9 Drawing Sheets

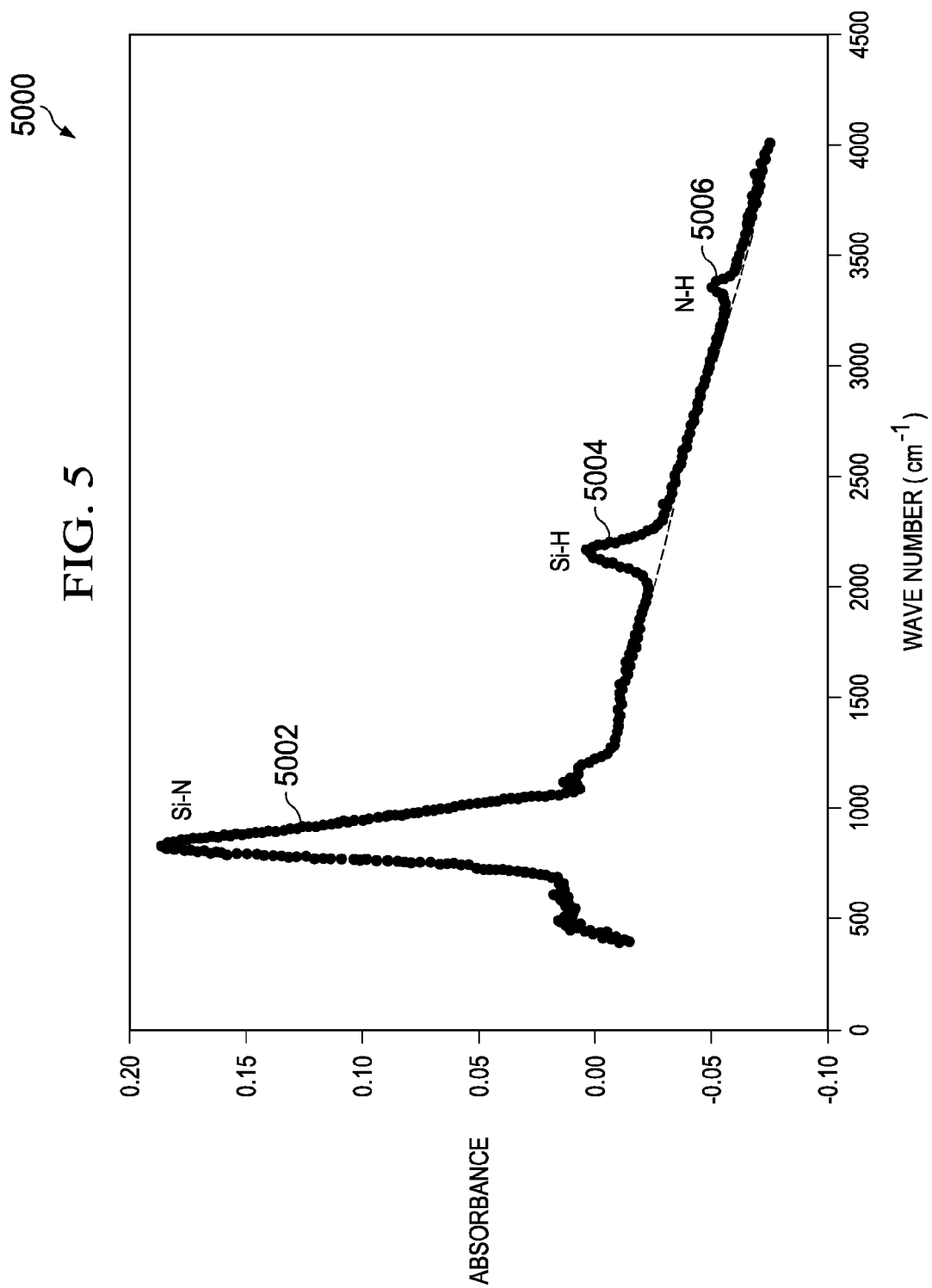

PASSIVATION OF INTEGRATED CIRCUITS CONTAINING FERROELECTRIC CAPACITORS AND HYDROGEN BARRIERS

CROSS-REFERENCE TO RELATED APPLICATIONS

This is a divisional of U.S. application Ser. No. 12/717,604, filed Mar. 4, 2010, which claims the benefit of U.S. Provisional Application 61/158,178, filed Mar. 6, 2009, both of which are incorporated by reference.

Moreover, this application is related to patent application Ser. No. 12/890,137 entitled "Hydrogen Passivation of Integrated Circuits" and patent application Ser. No. 12/890,219 entitled "Ferroelectric Capacitor Encapsulated with a Hydrogen Barrier". With its mention in this section, this patent application is not admitted to be prior art with respect to the present invention.

FIELD OF THE INVENTION

This invention relates to the field of integrated circuits. More particularly, this invention relates to hydrogen passivation of interface states in circuits containing ferroelectric capacitors and hydrogen barrier films.

DESCRIPTION OF THE VIEWS OF THE DRAWING

FIG. 5 illustrates the FTIR spectrum of a SiNxHy film.

DETAILED DESCRIPTION

Figure 1A:
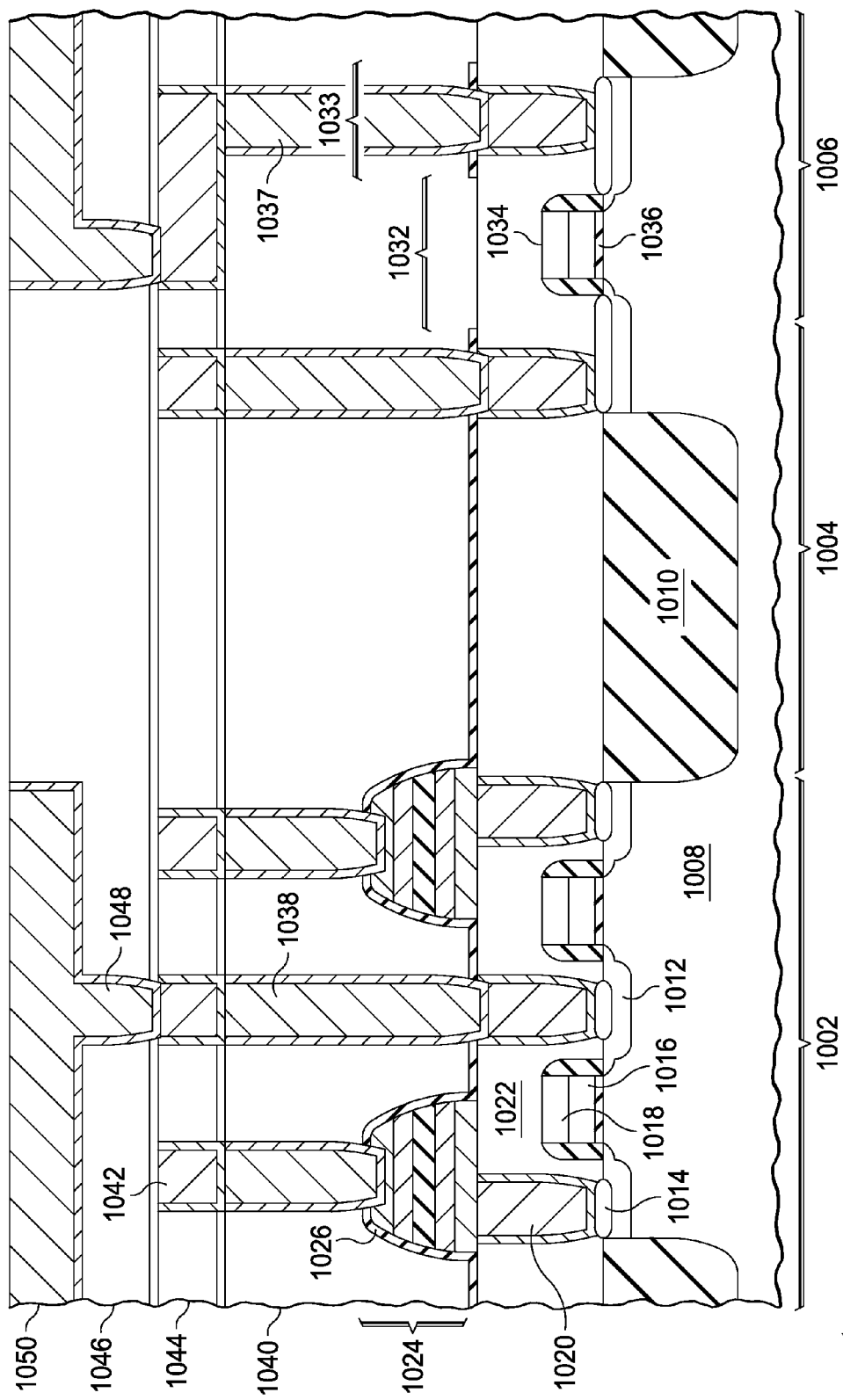
FIGS. 1A and 1B illustrate a portion of integrated circuits in accordance with alternative embodiments.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Ferroelectric capacitors (FeCaps) are frequently used in integrated circuits to provide nonvolatile Ferroelectric memory (FRAM). FeCaps may also be used as high-k capacitors or used in piezoelectric devices or pyroelectric devices. The construction of ferroelectric capacitors may be integrated into a CMOS process flow after transistor formation (e.g. after 'front-end' processing) and before the metallization or interconnection processing (e.g. before 'back-end' processing).

Many back-end processing steps include the use of hydrogen. For example, hydrogen may be used in the formation of trench etch-stop layers, etch clean operations, or copper sintering. During these processes, hydrogen may diffuse into the ferroelectric capacitor material and cause a degradation in the electrical properties of the FeCaps (such as degraded switched polarization of the FRAM memory cells). To protect the FeCaps from degradation, hydrogen barrier films may be deposited around the FeCaps to prevent hydrogen from diffusing into the FeCaps—thereby degrading the electrical properties of the FeCaps.

The final processing step in many conventional CMOS manufacturing flows is a forming gas anneal. The forming gas anneal uses hydrogen to passivate the defects that may occur in the single crystal lattice. In addition, the forming gas anneal uses hydrogen to passivate the interface states that may form due to the bonding mismatch between the single crystal silicon and the amorphous silicon dioxide gate dielectric. Specifically, the hydrogen may react with an incomplete silicon bond to form Si—H in a crystalline defect. Furthermore, the hydrogen may react with an incomplete silicon bond at the interface between the single crystal silicon and the amorphous SiO2 gate dielectric to form an Si—H bond. Passivation (the tying up of incomplete silicon bonds) of interface states may narrow the transistor threshold voltage (Vt) distributions and reduce 1/f noise in analog transistors. In addition, the passivation of crystal defects may reduce transistor junction leakage. Hydrogen barrier films (which may advantageously prevent the degradation of electrical properties of FeCaps) may have the unwanted effect of blocking hydrogen from diffusing to and passivating the defects and interface states of logic and analog transistors. Blocking the passivation of defects and interface states of logic and analog transistors may degrade the electrical properties in those regions of the integrated circuit.

A solution that may prevent hydrogen from reaching and degrading FeCaps while still allowing hydrogen to reach and advantageously passivate the interface of logic transistors and analog transistors, is to deposit a hydrogen barrier film over an integrated circuit that contains FeCaps and subsequently removing the hydrogen barrier film from the logic and analog transistor regions that are outside the FeCap regions. Furthermore, to prevent the hydrogen from diffusing into the FeCap regions from the regions where the hydrogen barrier film has been removed, a hydrogen diffusion buffer region may be constructed between the FeCap region and the logic and analog transistor regions. It is to be noted that the width of the buffer region may depend upon the thermal budget of the process steps performed after the patterning and etching of the hydrogen barrier film. Moreover, the hydrogen barrier film may be left intact over this buffer region.

The term "FeCap" refers to a capacitor with a ferroelectric dielectric. This dielectric may be composed of (but is not limited to) lead zirconate titanate (PZT).

The term "FeCap region" refers to an area of an integrated circuit where FeCaps are located. This may be an FRAM memory array or it may be an area within the integrated circuit containing ferroelectric capacitors. In embodiments infra, a hydrogen barrier layer overlies the FeCap region to protect the electrical properties of the ferroelectric material from being degraded by hydrogen.

The term "logic region" refers to the portion of an integrated circuit outside the FeCap region. The logic region may contain logic transistors, analog transistors, analog devices, high voltage transistors, and electrical components other than FeCaps.

The term "buffer region" refers to the portion of an integrated circuit that lies between an FeCap region and a logic region. In embodiments infra, a hydrogen diffusion buffer region is covered with a hydrogen barrier layer. The buffer region is sufficiently wide to prevent any hydrogen that enters through openings in the hydrogen barrier layer over the logic region from reaching and degrading the FeCap dielectric.

Figure 1B:
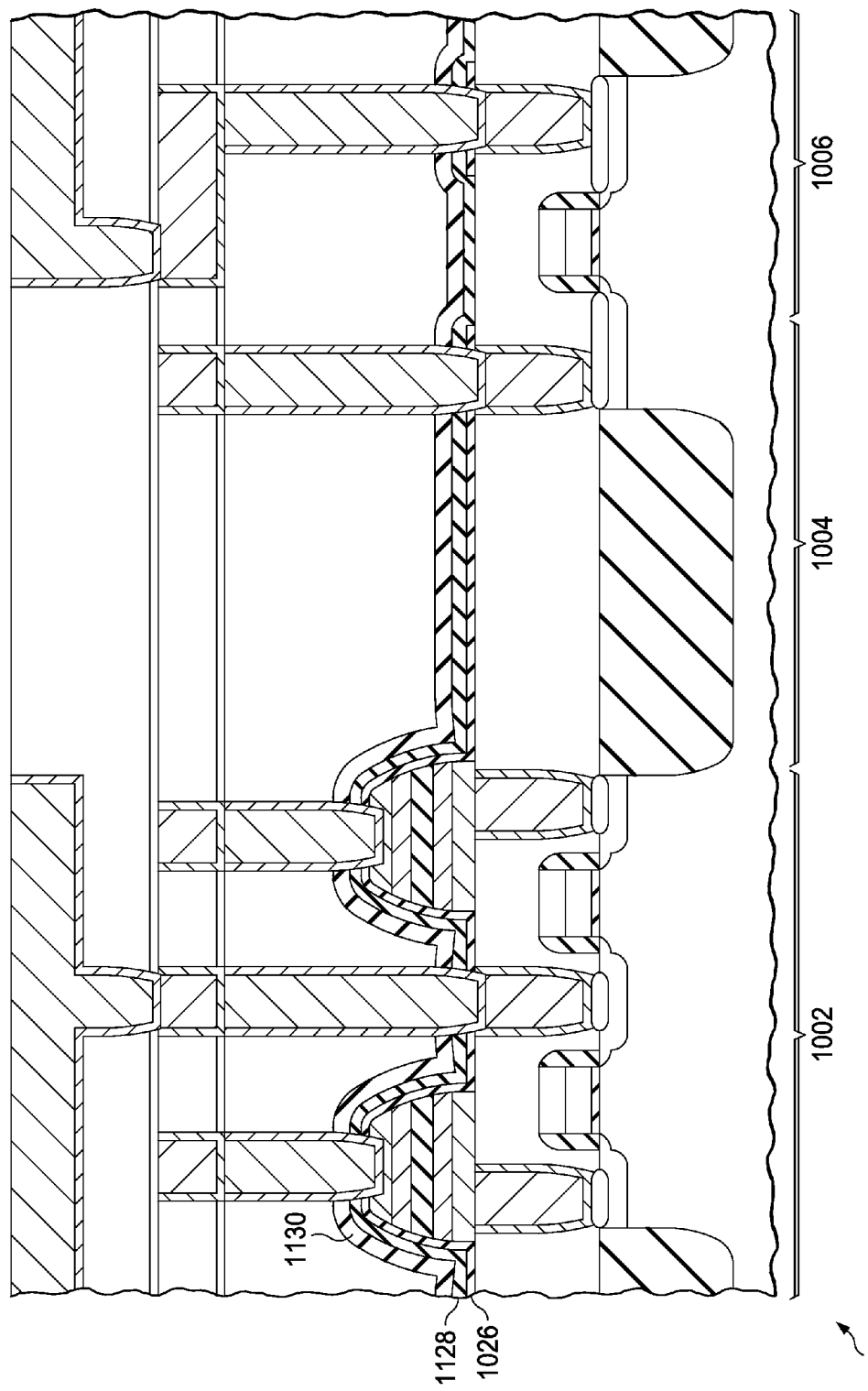

FIGS. 1A and 1B are alternative examples of integrated circuits illustrating two embodiments. The portion of the integrated circuit shown in FIG. 1A is built on a substrate (1008) that includes shallow trench isolation (1010), transistor gates (1016), source and drain diffusions (1012), silicided regions (1014) and (1018), a first pre-metal dielectric PMD-1 (1022), first contacts (1020), FeCaps (1024), and hydrogen barrier layer (1026) that may also function as a via etch stop landing pad (1033). Also included are two exemplary interconnect levels, (1042) and (1050), which include a second pre-metal dielectric PMD-2 (1040), second contacts (1038), a first inter-metal dielectric IMD-1 (1044), a first metal interconnect met-1 (1042), a second inter-metal dielectric IMD-2 (1046), via-1 (1048), and a second metal interconnect met-2 (1050). Either fewer levels or additional levels of interconnect plus passivation may exist in a completed integrated circuit.

The integrated circuit (1000) in FIG. 1A has an FeCap region (1002) (containing FeCaps (1024)), a hydrogen diffusion buffer region (1004), and a logic region (1006). Both the FeCap region (1002) and the buffer region (1004) are covered with the hydrogen barrier layer (1026). The logic region (1006), which contains logic transistors (1034) and may contain other components such as analog devices (not shown), has openings (1032) where the hydrogen barrier layer (1026) has been etched away to allow hydrogen to diffuse to the interface (1036) to passivate interface states and substrate defects that otherwise may degrade performance of the logic transistors (1034) and other electrical components (not shown) that are located in the logic region (1006). Optional second contact etch stop landing pads (1033) may be formed in the logic region (1006) using the hydrogen barrier layer (1026) as a reference layer by patterning the second contact etch stop landing pads (1033) during the step that creates the openings (1032) in the hydrogen blocking layer (1026). The second contact etch stop landing pad (1033) ensures that a second contact etch sees the same reference layer for the second contacts (1037) in the logic region (1006) as for the second contacts (1038) in the FeCap region (1002), resulting in uniform heights for second contacts (1037) and (1038).

The integrated circuit (1100) in FIG. 1B is the integrated circuit shown in FIG. 1A with a hydrogen releasing layer (1128) and a second hydrogen barrier layer (1130). The hydrogen releasing layer (1128) and the second hydrogen barrier layer (1130) is deposited over the FeCap region (1002), the buffer region (1004), and the logic region (1006) after the first hydrogen barrier layer (1026) was removed from portions (1032) of the logic region (1006). The hydrogen releasing layer (1028) and the second hydrogen barrier layer (1130) may further facilitate passivation of the integrated circuit (1100).

Figure 2A:
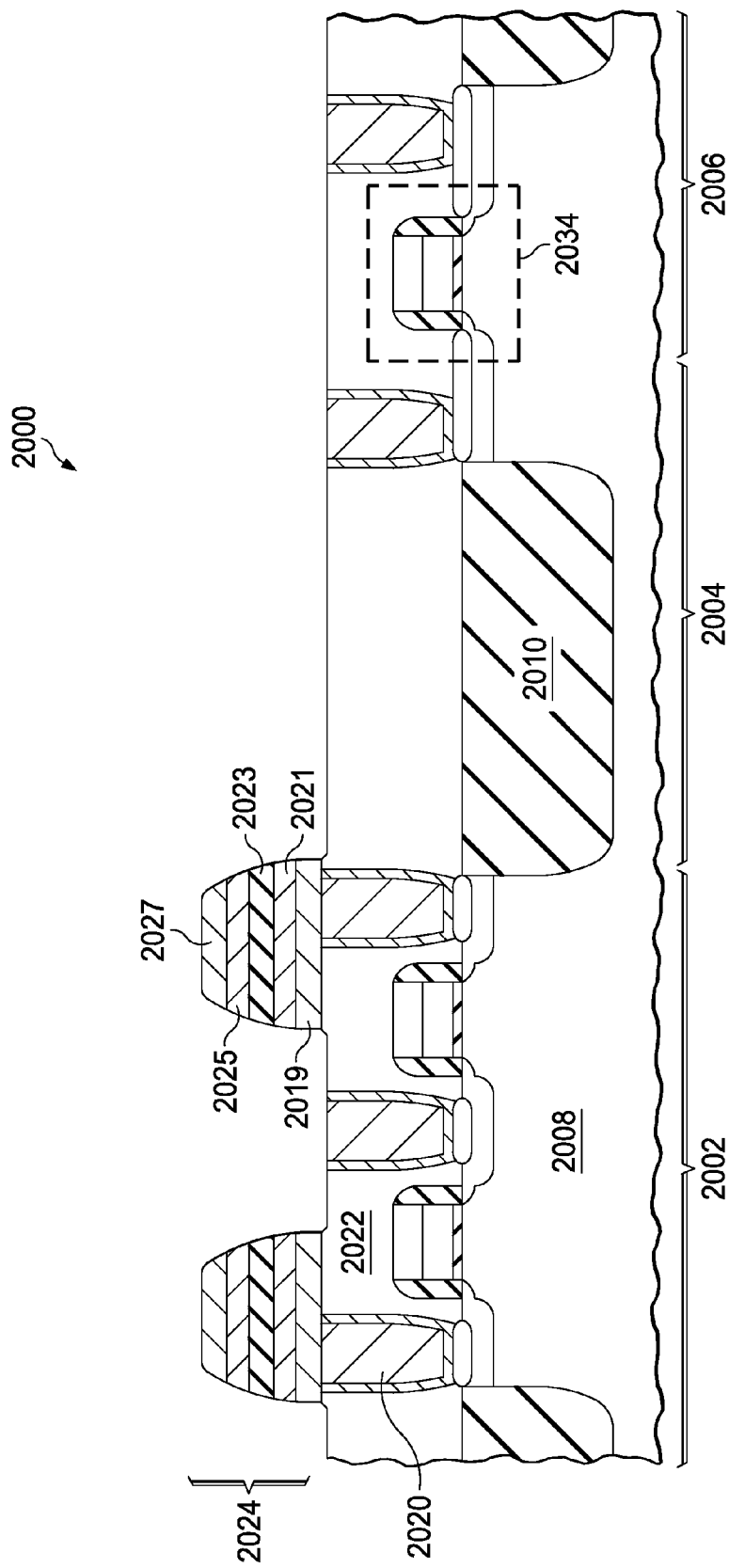
FIGS. 2A through 2D illustrate steps in an integrated circuit process flow according to an embodiment.

FIGS. 2A through 2D show the primary processing steps for forming an integrated circuit according to an illustrative embodiment. The partially processed integrated circuit (2000) shown in FIG. 2A, is built on substrate (2008) that contains STI isolation (2010), transistors (2034), first pre-metal dielectric PMD-1 (2022), first contacts CT-1 (2020), an FeCap (2002) region, a hydrogen diffusion buffer region (2004), and a logic region (2006). The FeCaps (2024) may be include optional top (2027) and bottom (2019) capacitor contact pads. These top (2027) and bottom (2019) capacitor contact pads are conductive and may also function as hydrogen barriers. The capacitor contact pads may be composed of (but not limited to) such materials as TiN, TiAlN, and TiAlON. The FeCaps have upper (2025) and lower (2021) capacitor electrodes that may be formed of a metallic material such as Pt, Pd, PdOx, IrPt alloys, Au, Ru, RuOx, (Ba, Sr, PB)RuO3, (Ba,Sr)RuO3, or LaNiO3. The FeCaps also contain ferroelectric material (2023) that may be composed of (but is not limited to) lead zirconate titanate (PZT) (2023).

Figure 2B:
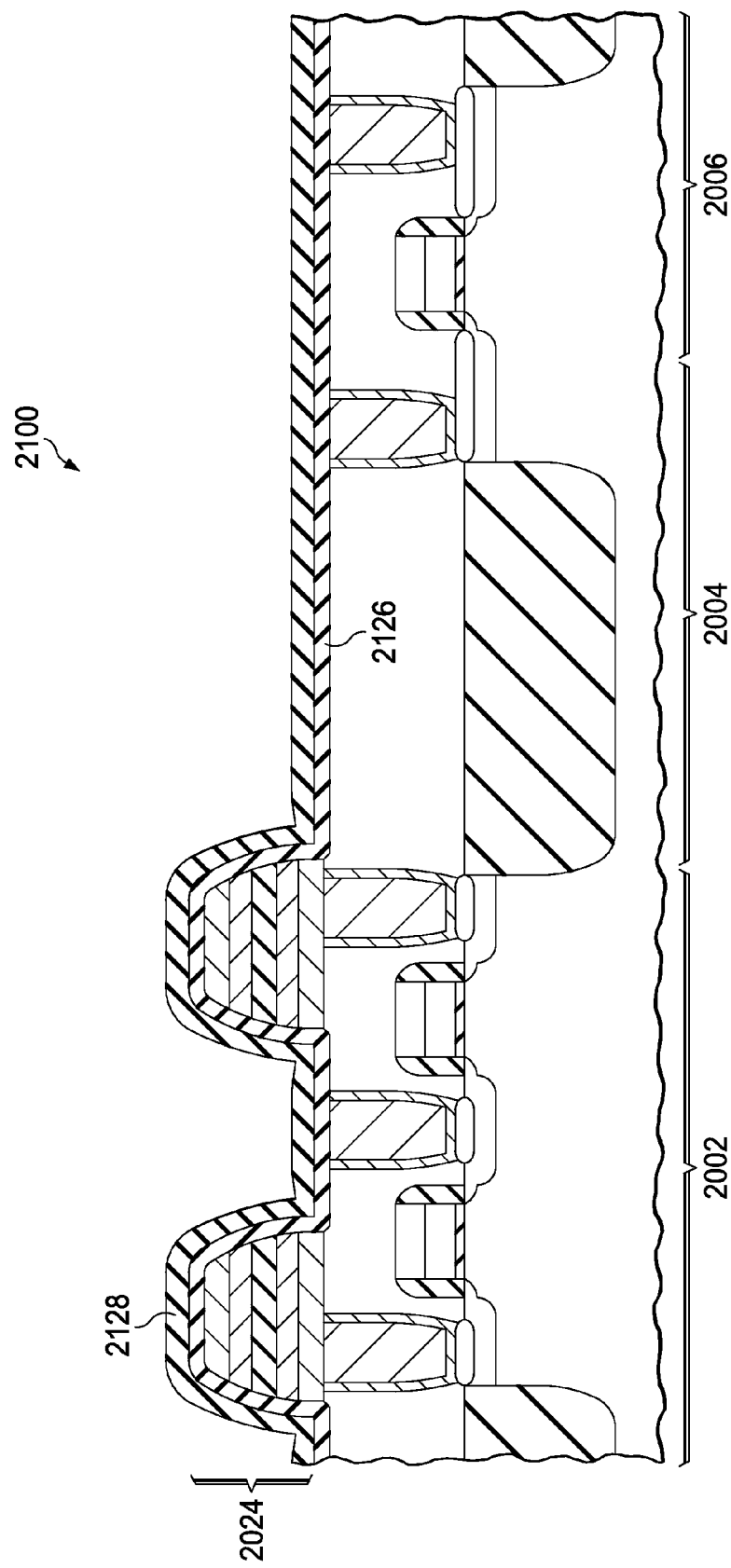

FIG. 2B shows the integrated circuit (2100) after a hydrogen barrier dielectric layer (containing hydrogen barrier films (2126) and (2128)) are deposited over the FeCaps (2024) and over the remainder of the integrated circuit (2100). The hydrogen barrier layer may be formed of one or more dielectric films containing AlOx, AlONx, SiNx, SiNxHy, etc. The hydrogen barrier layer may also function as an etch stop layer for the second contact etch.

In this example embodiment, the hydrogen barrier layer is composed of two hydrogen barrier films. The first film (2126) is formed of nitrided AlOx. The AlOx layer (2126) may be deposited using physical vapor deposition (PVD) or atomic layer deposition (ALD). The nitridation of the AlOx material may improve the hydrogen barrier properties and may be accomplished by exposing the AlOx to a nitrogen-containing plasma (or by annealing the AlOx at about 400 C in a nitrogen containing ambient). The second hydrogen barrier film (2128) is formed of SiNxHy. It is deposited over the nitrided AlOx layer and it may improve the hydrogen barrier properties. SiNxHy films typically contain some hydrogen in the form of Si—H and N—H bonds. In this embodiment, the hydrogen barrier SiNxHy film (2128) is a low Si—H bond material (preferably formed using plasma enhanced chemical vapor deposition (PECVD)) having a relatively high nitrogen (N2) gas flow and a relatively low ammonia (NH3) flow. An example PECVD process to form this film is given in Table 1. An equivalent hydrogen barrier film may be formed using other means such as high density plasma deposition (HDP).

TABLE 1

| Process Variable | VALUE | UNITS |
| --- | --- | --- |
| Deposition | PECVD | — |
| High Frequency Power | 700 | watts |
| Low Frequency Power | 100 | watts |
| Pressure | 2.25 | Torr |
| Temperature | 400 | C |
| SiH4 | 150 | sccm |
| N2 | 1400 | sccm |
| NH3 | 750 | sccm |

The hydrogen barrier films (2126) and (2128) may remain over the FeCap region (2002) to prevent degradation of the FeCaps and also over the buffer region (2004), to ensure that any hydrogen which enters the logic area (2006) is prevented from diffusing to (and thereby degrading) the FeCaps (2024). The length of the buffer region (2004) depends upon manufacturing parameters such as the temperature and the length of time at temperature (thermal budget) during process steps that contain hydrogen and any subsequent process steps.

Figure 2C:
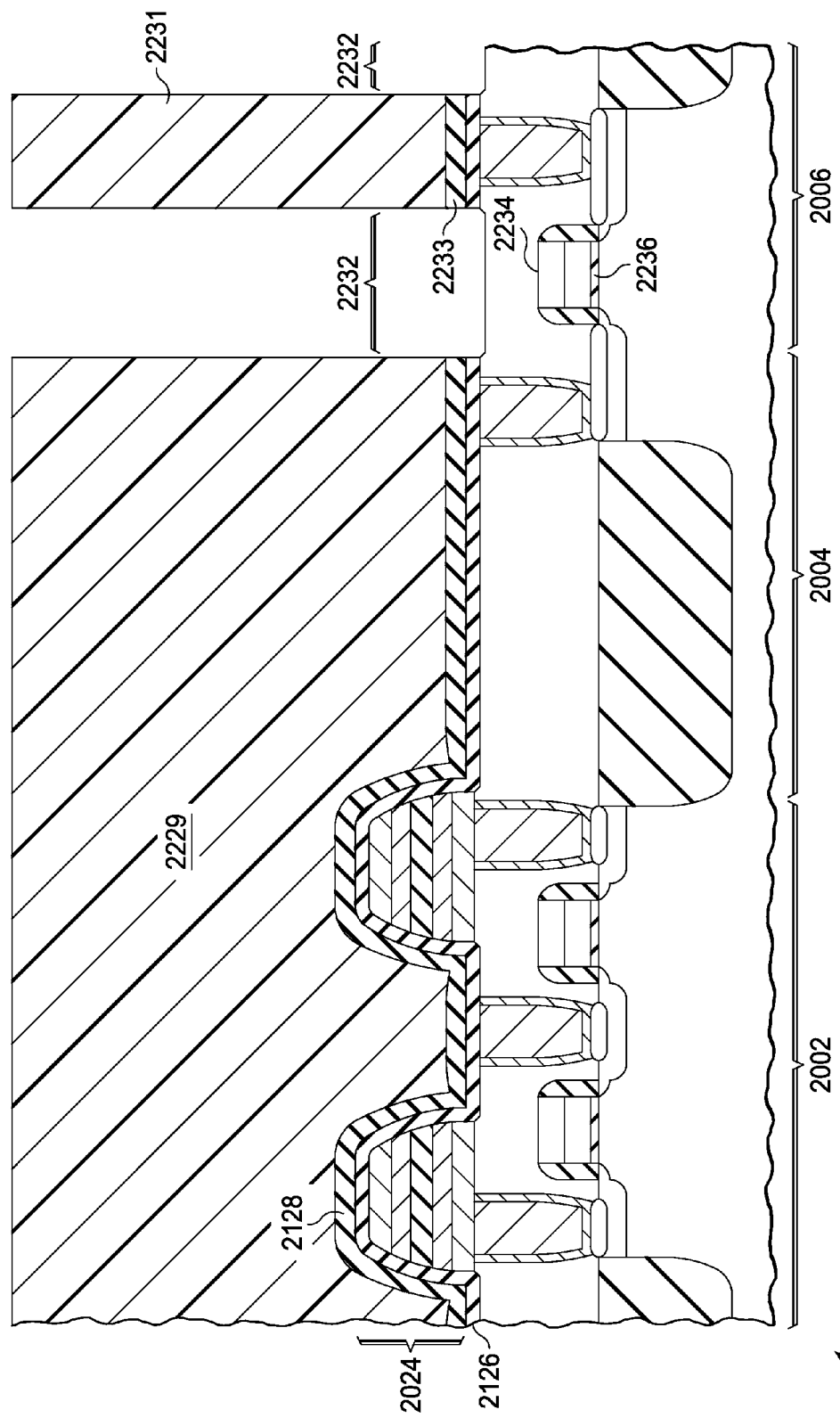

A photoresist pattern (2229) is formed over the integrated circuit (2200) in FIG. 2C. The photoresist pattern (2229) protects the hydrogen barrier film (2128) over the FeCap region (2002) and over the hydrogen diffusion buffer region (2004). However, the pattern (2229) is open over a portion of the logic region (2006) and the hydrogen barrier films (2126) and (2128) were etched from this region (2232) to permit hydrogen to diffuse to the substrate interface (2236) and thereby passivate the interface states and crystal defects. An optional photoresist pattern (2231) may be formed in the logic region (2006) to pattern a second contact landing pad (2233) where a second contact is to be etched.

Figure 2D:
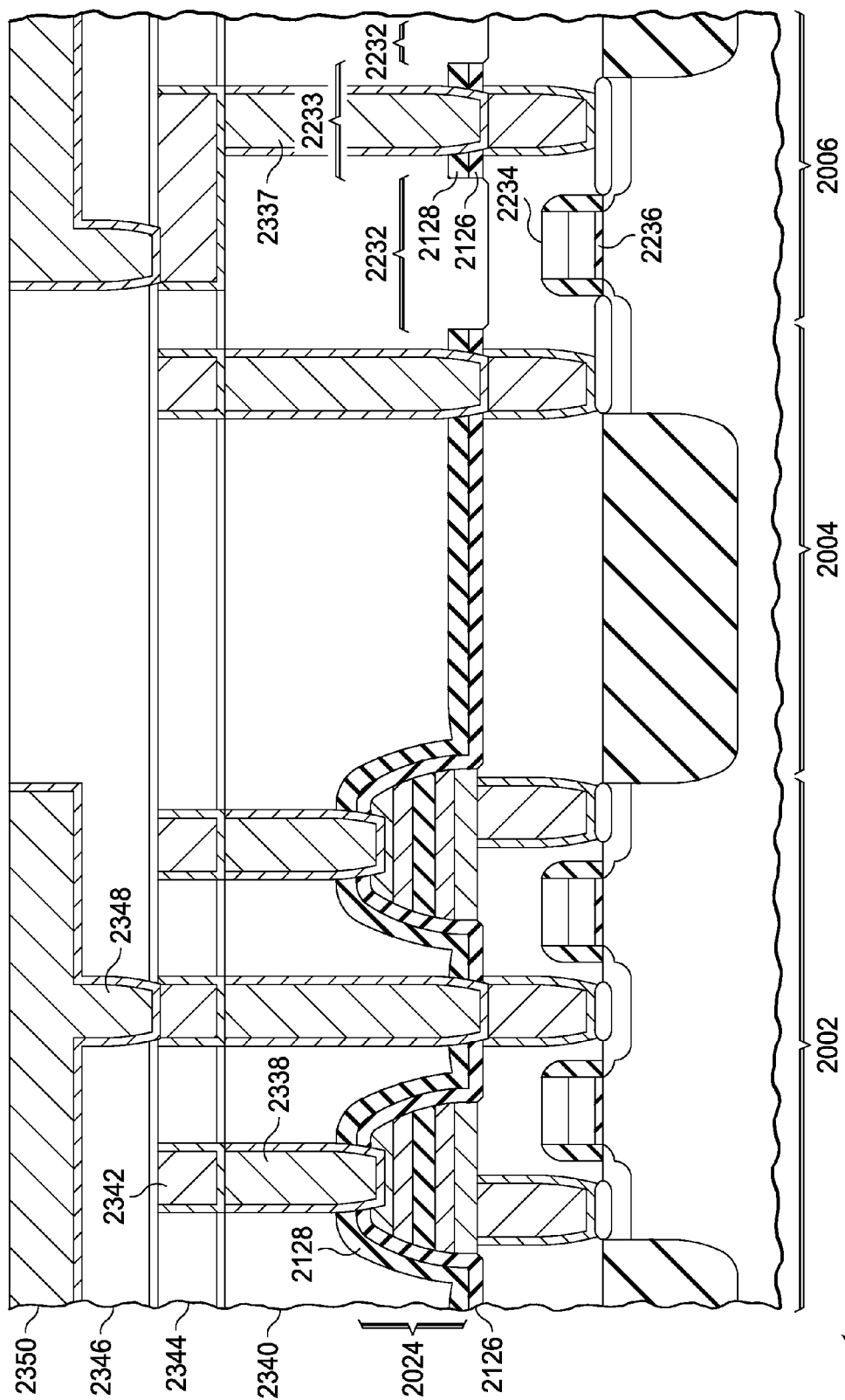

FIG. 2D shows the integrated circuit (2300) after the photoresist patterns (2229), (2231) are removed and then two levels of interconnect (2342), (2350) are added using well known methods. In this example embodiment, dielectric layers PMD-2 (2340), IMD-1 (2344), and IMD-2 (2346) are added, second contacts (2337), (2338) and via-1 (2348) are formed, and interconnect layers met-1 (2342) and met-2 (2350) are also formed. Either fewer levels or additional levels of interconnect plus passivation may be present in a completed integrated circuit (2300).

Figure 3:
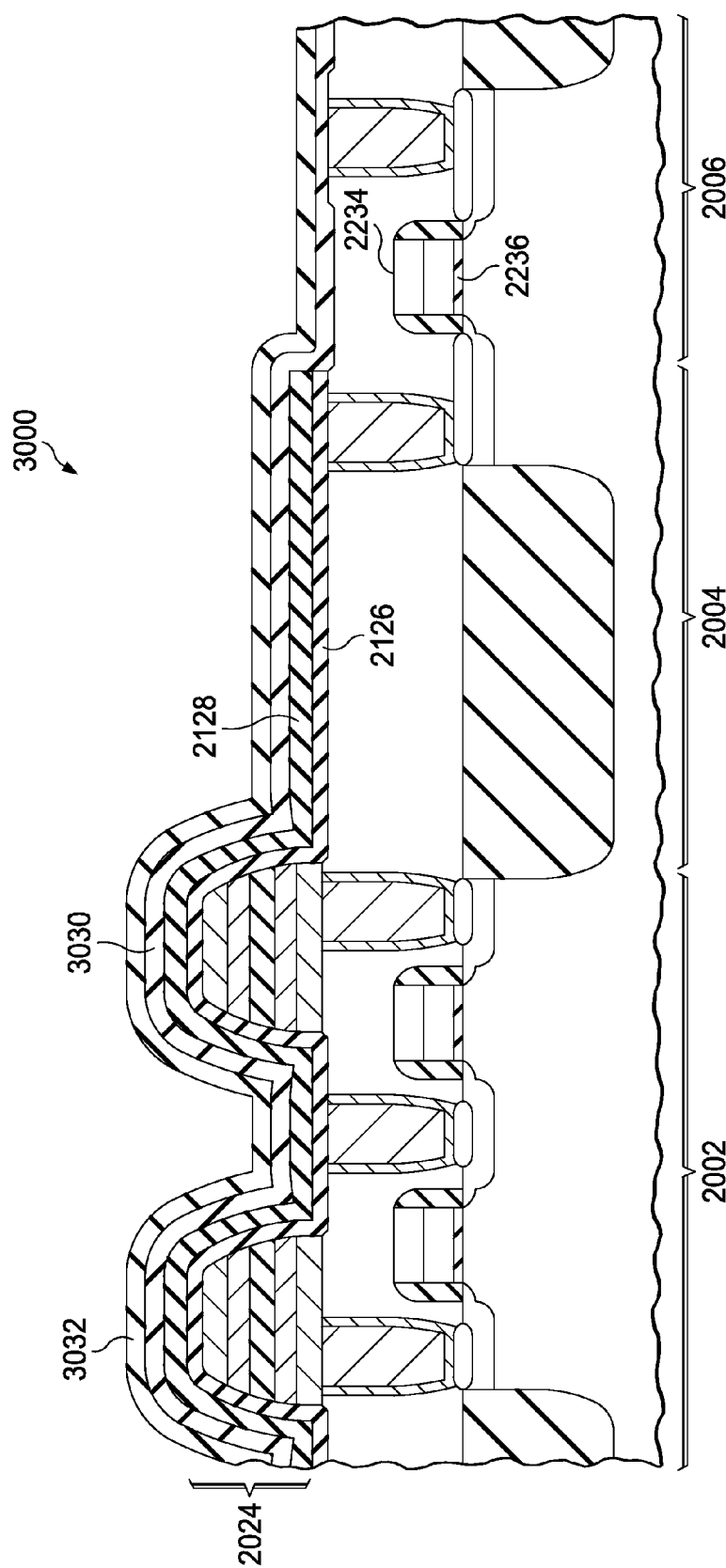
FIG. 3 illustrates a portion of an integrated circuit.

Another integrated circuit embodiment (3000) is illustrated in FIG. 3. A hydrogen releasing film (3030) may be formed under a second hydrogen barrier layer (3032) to enhance the passivation of the peripheral regions (such as the logic region (2006) of an integrated circuit. In this embodiment, the hydrogen releasing film (3030) and a second hydrogen barrier layer (3032) are deposited after the first hydrogen barrier layer (containing hydrogen barrier films (2126) and (2128)) has been etched from the logic region (2006). The hydrogen releasing film (3030) may be a SiNxHy film deposited using HDP with conditions such as those shown in Table 2 to form a SiNxHy film with a high concentration of Si—H bonds.

TABLE 2

| Process Variable | VALUE | UNITS |
|---|---|---|
| Deposition | HDP | — |
| Low Frequency Power | 1850 | watts |
| Pressure | 15 | mTorr |
| Temperature | 400 | C |
| SiH4 | 40 | sccm |
| N2 | 400 | sccm |
| Ar | 250 | sccm |

The hydrogen in a SiNxHy film is primarily in the form of Si—H and N—H bonds. Si—H bonds are of a lower bond energy (e.g. about 3.34 eV) than are N—H bonds (e.g. about 4.05 eV). The hydrogen in high Si—H bond containing SiNxHy films tends to dissociate during thermal processing (such as copper anneals). In this embodiment, hydrogen from the high Si—H bond containing SiNxHy film (3030) may provide sufficient hydrogen to passivate the interface states and crystal defects in the periphery devices (such as the transistor (2234)). Therefore, when this hydrogen releasing film (3030) is used, the final hydrogen anneal that is typically used in conventional CMOS process flows may be omitted.

In an alternative embodiment, film (3030) may be a deuterium releasing film. A deuterium releasing film (3030) may also replace the need for the final hydrogen anneal because deuterium may also enhance the passivation of the peripheral regions (such as the logic region (2006) of an integrated circuit. In this embodiment, the deuterium releasing film is a SiNxDy film with more Si-D bonds than N-D bonds.

In this embodiment, a second hydrogen barrier layer (3032) is deposited on top of the hydrogen releasing film (3030). The second hydrogen barrier layer (3032) is added to prevent hydrogen from diffusing away from the substrate interface (2236) and subsequently lost. The hydrogen barrier layer (3032) may also enhance the passivation of the interface states and crystal defects by keeping the hydrogen in close proximity to the substrate surface.

Figure 4:
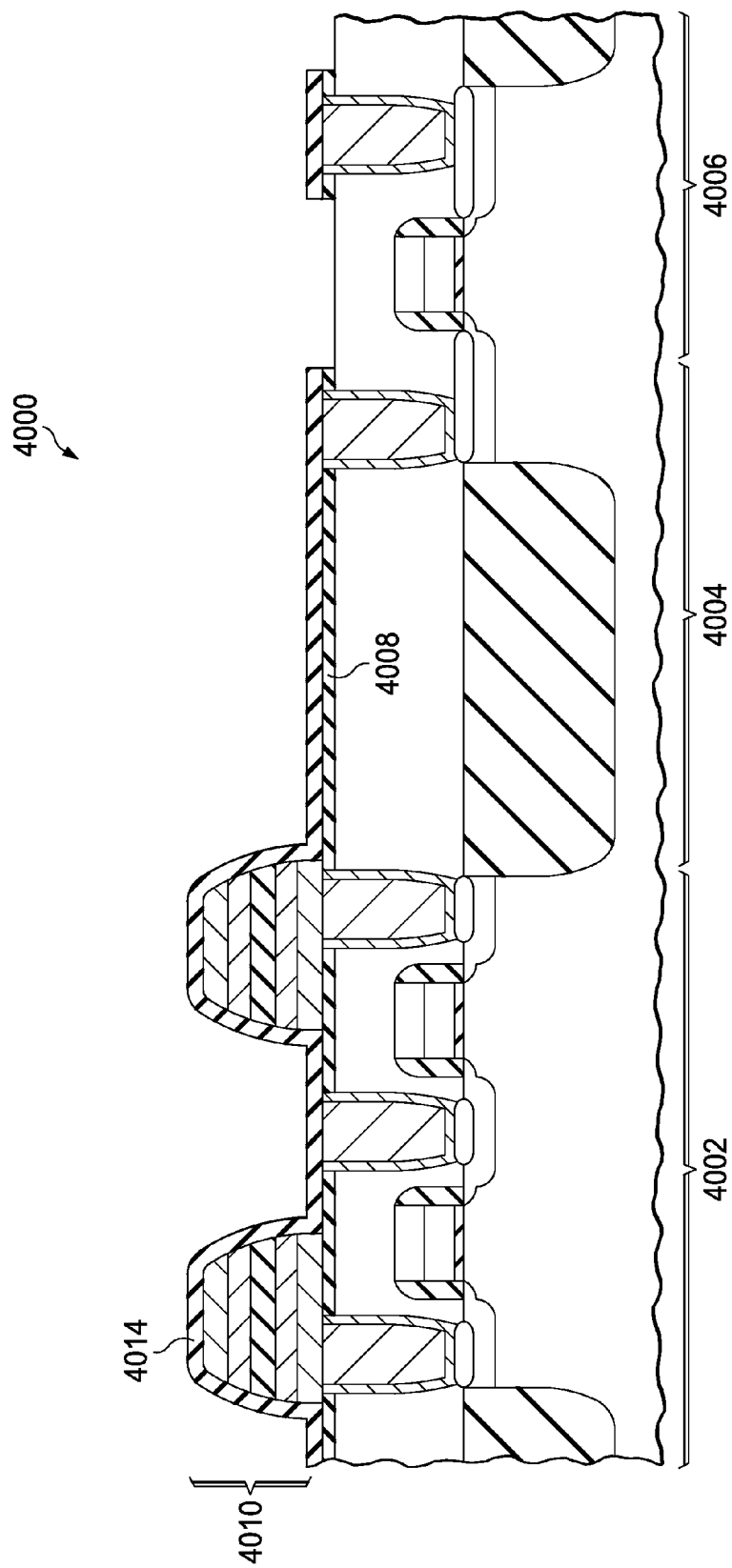
FIG. 4 illustrates an integrated circuit according to an embodiment.

Another integrated circuit embodiment (4000) is illustrated in FIG. 4. In addition to a first hydrogen barrier layer (4014) deposited over the FeCaps (4010), a second hydrogen barrier layer (4008) may be deposited under the FeCaps (4010) to fully encapsulate the FeCaps (4010) to better protect them from degradation due to hydrogen. In this embodiment, the hydrogen barrier layers (4014), (4008) are patterned and etched from the logic area (4006) to allow hydrogen to reach and passivate the substrate interface and crystal defects.

FIG. 5 is an example Fourier transform infrared spectroscopy (FTIR) spectrum (5000) of the example SiNxHy hydrogen barrier film of Table 1. The spectrum consists of three major peaks: a Si—N peak (5002) at approximately 800 $cm^{-1}$, a Si—H peak (5004) at approximately 2100 $cm^{-1}$, and an N-H peak (5006) at approximately 3400 $cm^{-1}$. The area under each peak is proportional to the number of bonds in the SiNxHy sample. For example, the area under the peak at 800 $cm^{-1}$ is proportional to the number of Si—N bonds in the sample. The absorption coefficient (which is the proportionality constant between the number of bonds in the sample and the area under the peak) may be different for different bonding types. A larger peak may mean that there are more of that type of bond in the sample or it may mean that the absorption coefficient for that bond is stronger. A figure of merit for the Si—H content of a SiNxHy film is calculated as (Si—H absorbance)/(N—H absorbance×1.4) where absorbance is the area under the peak in the FTIR spectrum. The figure of merit for a low Si—H content hydrogen barrier film is 0.05 or less, but preferably about 0.04 or less, and more preferably about 0.03 or less.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising:
   providing a partially processed integrated circuit having a ferroelectric capacitor region, a buffer region, and a logic region containing a second contact touching a first contact where said first contact touches a source or drain diffusion of a transistor; said partially processed integrated circuit having an overlying first hydrogen barrier layer;
   forming a photoresist pattern that is closed over said ferroelectric capacitor region and over said buffer region but is open over a portion of said logic region; and
   etching said first hydrogen barrier layer from said portion of said logic region;
   wherein said first hydrogen barrier layer touches a portion of said second contact within said logic region.

2. The process of claim 1 further comprising:
   forming said photoresist pattern over said logic region for a second contact landing pad; and
   etching said first hydrogen barrier layer to form a second contact landing pad.

3. The process of claim 1 wherein said providing step includes a second hydrogen barrier layer that overlies said first hydrogen barrier layer, and further wherein said etching step includes etching a second dielectric hydrogen barrier layer from said portion of said logic region.

4. The process of claim 3 further comprising the steps:
forming said photoresist pattern over said logic region for a second contact landing pad; and
etching said first hydrogen barrier layer and said second hydrogen barrier layer to form a second contact landing pad.

5. The process of claim 1 further comprising:
depositing at least one of a hydrogen releasing layer and a deuterium releasing layer over said integrated circuit after said step of etching said first hydrogen barrier layer; and
depositing a second hydrogen barrier over said at least one of a hydrogen releasing layer and a deuterium releasing layer.

6. The process of claim 5 where said hydrogen releasing layer is $SiN_xH_y$ with more Si—H bonds than N—H bonds and where said deuterium releasing layer is $SiN_xD_y$ with more Si-D bonds than N-D bonds.

7. The process of claim 6 where said hydrogen releasing layer is formed using an HDP process with about 1850 watts of low frequency power, about 15 mTorr pressure, about 400 C temperature, about 250 sccm Ar, about 400 sccm N2, and about 40 sccm SiH4 and where said deuterium releasing layer is formed using about 40 sccm SiD4.

8. The process of claim 1 wherein said first hydrogen barrier layer is composed of at least one of AlO, AlON, and $SiN_xH_y$.

9. The process of claim 1 wherein said first hydrogen barrier layer is composed of a $SiN_xH_y$ film which overlies a nitrided AlOx film.

10. The process of claim 9 where said $SiN_xH_y$ film is formed using a plasma enhanced chemical vapor deposition process with about 700 watts of high frequency power, about 100 watts of low frequency power, about 2.25 Torr pressure, about 400 C temperature, about 1400 sccm N2, about 750 sccm NH3, and about 150 sccm SiH4.

11. A process of forming an integrated circuit, comprising:
providing a partially processed integrated circuit having a ferroelectric capacitor region, a buffer region, and a logic region with an overlying first hydrogen barrier layer;
forming a photoresist pattern that is closed over said ferroelectric capacitor region and over said buffer region but is open over a portion of said logic region;
etching said first hydrogen barrier layer from said portion of said logic region;
depositing at least one of a hydrogen releasing layer and a deuterium releasing layer over said integrated circuit after said step of etching said first hydrogen barrier layer; and
depositing a second hydrogen barrier over said at least one of a hydrogen releasing layer and a deuterium releasing layer.

12. A process of forming an integrated circuit, comprising:
providing a partially processed integrated circuit having a ferroelectric capacitor region, a buffer region, and a logic region;
forming a first hydrogen barrier layer over said ferroelectric capacitor region;
forming a ferroelectric capacitor over a portion of said first hydrogen barrier layer;
forming a second hydrogen barrier layer over said ferroelectric capacitor region, said ferroelectric capacitor, said buffer region, and said logic region;
forming a photoresist pattern that is closed over said ferroelectric capacitor region and over said buffer region but is open over a portion of said logic region; and
etching said second hydrogen barrier layer from said portion of said logic region.

* * * * *